US005319659A

United States Patent [19]
Hohimer

[11] Patent Number: 5,319,659
[45] Date of Patent: Jun. 7, 1994

[54] SEMICONDUCTOR DIODE LASER HAVING AN INTRACAVITY SPATIAL PHASE CONTROLLER FOR BEAM CONTROL AND SWITCHING

[75] Inventor: John P. Hohimer, Albuquerque, N. Mex.

[73] Assignee: The United States of America as represented by the United States Department of Energy, Washington, D.C.

[21] Appl. No.: 883,315

[22] Filed: May 14, 1992

[51] Int. Cl.⁵ .............................................. H01S 3/19
[52] U.S. Cl. ........................................ 372/45; 372/50
[58] Field of Search ............................ 372/45, 46, 50

[56] References Cited

U.S. PATENT DOCUMENTS

| | | | |
|---|---|---|---|
| 4,719,636 | 1/1988 | Yamaguchi | 372/50 |
| 4,751,705 | 6/1988 | Hadley et al. | 372/18 |
| 4,803,686 | 2/1989 | Brock | 372/44 |
| 4,847,856 | 7/1989 | Sugimura et al. | 372/96 |
| 4,903,275 | 2/1990 | Ettenberg et al. | 372/50 |
| 4,940,303 | 7/1990 | Abeles et al. | 372/96.11 |
| 4,965,806 | 10/1990 | Ashby et al. | 372/45 |
| 4,995,048 | 2/1991 | Kuindersma et al. | 372/50 |
| 5,003,550 | 3/1991 | Welch et al. | 372/50 |

OTHER PUBLICATIONS

M. Sakamoto et al., "High Power, High Brightness 2W (200 μm) and 3W (500 μm) CW AlGaAs Laser Diode Arrays with Long Lifetimes", Electronics Letters, vol. 26, No. 11, May 24, 1990, pp. 729–730.
J. Salzman et al., "Tilted-Mirror Semiconductor Lasers", Appl. Phys. Lett., vol. 47, No. 1, Jul. 1, 1985.
R. Lang et al., "Modal Analysis of Semiconductor Lasers with Nonplanar Mirrors", IEEE Journal of Quantum Electronics, vol. QE-22 No. 3, pp. 463–470, Mar. 1986.
S. Mukai et al., "Laser Beam Scanning Using a Local Deflector Integrated with an Effective Mode Filter", Appl. Phys. Lett., vol. 51, No. 25, pp. 2091–2093, Dec. 21, 1987.
S. Mukai et al., "Analysis of a Double-Heterostructure Spatial-Phase Controller for Diode-Laser Beam Steering", IEEE Journal of Quantum Electronics, vol. 24, No. 12, pp. 2415–2422, Dec. 1988.
S. Mukai et al., "Beam Scanning and Switching Characteristics of Twin-Striped Lasers with a Reduced Stripe Spacing", Optical and Quantum Electronics, vol. 17, pp. 431–434, 1985.
D. Scifres et al., "Beam Scanning with Twin-Stripe Injection Lasers", Appl. Phys. Lett., vol. 3, No. 8, pp. 702–704, Oct. 15, 1978.
J. Hohimer et al., "Integrated Integrated Injection-Locked High-Power CW Diode Laser Arrays", Appl. Phys. Lett., vol. 55, No. 6, pp. 531–533, Aug. 7, 1989.
J. Hohimer et al., "Injection-Locking Characteristics of Gain-Guided Diode Laser Arrays with an 'On-Chip' Master Laser", Appl. Phys. Lett., vol. 56, No. 16, pp. 1521–1523, Apr. 16, 1990.
J. Hohimer et al., "Interelement Coupling in Gain-Guided Diode Laser Arrays", Appl. Phys. Lett., vol. 48, No. 22, pp. 1504–1506, Jun. 2, 1986.
J. H. Hohimer et al., "Near-Diffraction-Limited Angle-Switchable Output Beam from a Broad-Area Diode Laser with an Intracavity Spatial Phase Controller", Appl. Phys. Lett., vol. 58, No. 25, pp. 2886–2888, Jun. 24, 1991.

Primary Examiner—Rodney B. Bovernick
Assistant Examiner—Robert E. Wise
Attorney, Agent, or Firm—Karuna Ojanen; James H. Chafin; William R. Moser

[57] ABSTRACT

A high-power broad-area semiconductor laser having a intracavity spatial phase controller is disclosed. The integrated intracavity spatial phase controller is easily formed by patterning an electrical contact metallization layer when fabricating the semiconductor laser. This spatial phase controller changes the normally broad far-field emission beam of such a laser into a single-lobed near-diffraction-limited beam at pulsed output powers of over 400 mW. Two operating modes, a thermal and a gain operating mode, exist for the phase controller, allowing for steering and switching the beam as the modes of operation are switched, and the emission beam may be scanned, for example, over a range of 1.4 degrees or switched by 8 degrees. More than one spatial phase controller may be integrated into the laser structure.

26 Claims, 5 Drawing Sheets

SEMICONDUCTOR DIODE LASER HAVING AN INTRACAVITY SPATIAL PHASE CONTROLLER FOR BEAM CONTROL AND SWITCHING

The United States Government has rights in this invention pursuant to Contract No. DE-AC04-76DP00789 between the U.S. Department of Energy and American Telephone and Telegraph Company.

TECHNICAL FIELD

This invention relates to semiconductor diode lasers in general, and in particular the integration of a beam scanning and switching structure with the semiconductor laser source.

BACKGROUND ART

Semiconductor diode lasers provide an intense efficient source of laser radiation. Continuous Wave (cw) semiconductor lasers have achieved output power of several watts by using either a broad-area or an array geometry. Such devices generally emit their radiation in a broad twin-lobed far-field beam in the direction parallel to the active layer of the laser. This broad twin-lobed output beam limits the ability of these laser sources to be focused tightly or to be propagated over long distances.

Many potential applications of high-power diode lasers, such as optical radar, satellite communications, laser printers, optical information storage and retrieval, and laser-to-fiber couplings, require a near-diffraction-limited single-lobed output beam which can be angle-scanned or switched.

It is thus desirable to integrate the beam scanning and switching mechanism with the laser source to reduce system complexity and size, and to increase reliability and stability. In the case of low-power narrow-stripe diode lasers, this has been done by incorporating a spatial phase controller into the laser cavity. For twin-stripe lasers, differential pumping has been used for beam scanning and switching. For high-power ten-stripe diode laser arrays, a separate on-chip master laser may control the array and provide beam scanning.

U.S. Pat. No. 5,003,550 by Welch et. al. discloses an invention that uses a low power (10-100 mW) narrow-stripe (5 micron wide) single-mode laser as a master oscillator. The lasing output from this master oscillator is subsequently acted on by amplifiers and phase controllers which are located external to the laser cavity. The sole function of the phase control array of Welch et. al. is to provide lateral beam steering of the amplified output beam, but it in no way does the array control the lasing behavior of the master oscillator laser. The current invention discloses a high-power broad-area laser with an internal phase controller that phase locks the lasing beam.

U.S. Pat. No. 4,995,048 by Kuindersma et. al. discloses a phase controller serving a very different purpose than the invention disclosed herein. The Kuindersma invention relates to narrow-stripe (few micron wide) lasers of the double channel planar buried heterostructure and buried heterostructure types which, because of the narrowness of their waveguiding region, operate in a single lateral mode. The phase control section in this type of laser counteracts the longitudinal variation in the refractive index in the Bragg reflector to prevent mode oscillation or mode jumping of the longitudinal lasing mode. Because the phase shift generated by the phase control section is uniform in the lateral extent of the laser, no beam steering or switching is possible. Additionally, the type of laser differs between the instant invention and the Kuindersma invention. For example, the current invention discloses mirrors created by cleaving facets of the semiconductor material, whereas the Kuindersma invention uses a distributed Bragg reflector at one end of the laser.

U.S. Pat. No. 4,965,806 by Ashby et. al. discloses a broad-area semiconductor laser diode that includes a structure for controllably varying a lateral refractive index profile of the diode to substantially compensate for junction heating effects during operation. The invention only uses thermal mode of operation to phase-lock the laser. The invention disclosed herein combines thermal mode with gain mode for additional flexibility in angle-switching and scanning.

U.S. Pat. No. 4,940,303 by Abeles et. al. discloses a phase control array located external to the laser, although both the laser and phase control array may be formed on the same substrate. The essential feature of the waveguide array phase controller of Abeles et. al. is the nonconstant, i.e., linearly increasing, spacing between adjacent parallel equal-length waveguide elements essential for reducing the side lobe intensity of the output beam. Additionally, separate electrical contacts and circuitry for controlling the phase retardation are required for each of the many (from 12 to 400) waveguides. Finally, a far-field beam detector is an essential part of the system for phase sensing and feedback to the phase control circuitry.

U.S. Pat. No. 4,903,275 by Ettenberg et. al. discloses a laser structure having an array of two or more regularly spaced waveguides, each with separate electrical contacts extending parallel to the waveguides over the entire length of the array. Under normal operating conditions, i.e., with identical electrical currents to each separate waveguide in the array, the array is phase-locked to produce a single-lobed output beam. When the electrical current to one or more of the waveguides is altered from this normal operating condition, the array becomes dephased, resulting in a multiple-lobed output beam. Beam steering is possible by varying the electrical current to each of the separate waveguides to control the nature and number of the far-field emission lobes. The type of semiconductor diode laser used is of the index-guided type instead of the gain-guided type disclosed herein.

U.S. Pat. No. 4,847,856 by Sugimura et. al. discloses a laser using fixed one-quarter-wavelength phase shifts in at least three locations. The phase shift is constant across the lateral extent of the laser and is built into the distributed-feedback semiconductor diode laser structure. Note that because the phase shift generated by the phase control section is uniform in the lateral extent of the laser, no beam steering or switching is possible. Moreover, the application of electrical current to the phase-shift sections in the Sugimura laser results in a modulation of the lasing frequency. Finally the laser of Sugimura et. al. uses a distributed-feedback type laser instead of a gain-guided laser as disclosed herein.

U.S. Pat. No. 4,803,686 by Brock discloses techniques for wavefront sensing for adaptive optics. A semiconductor diode laser is used with a narrow entrance aperture and only supports a single transverse mode of oscillation. The laser requires injection from a weak input probe beam having wavefront aberrations. The laser acts principally to spatially filter this input probe beam, to amplify the beam via a nonlinear four-wave mixing process, and to generate a uniphase reference output beam for interfering with the aberrated beam in order to detect the wavefront aberrations.

U.S. Pat. No. 4,751,705 by Hadley et. al. discloses a semiconductor diode laser having a single-lobed far-field emission beam which can be scanned in angle. However, it too differs from the invention disclosed herein. It discloses a laser using injection locking techniques to control the phase tilt across a semiconductor diode laser array to produce a single-lobed far-field emission beam, scannable in angle. This method requires a separate single-frequency wavelength-tunable laser source for injection locking the array. The injected radiation is confined to a single end-element of the array. The array emission beam is scanned in angle either by varying the frequency of the injected light or by varying the electrical current to the diode laser array. In the latter case, varying the electrical current will alter the output power level which may be undesirable for many applications. Also, the beam scanning by Hadley et. al. is uni-directional, being determined by which side of the array is injected.

U.S. Pat. No. 4,719,636 by Yamaguchi discloses a laser with a uniform phase shift across the lateral extent of the laser. The phase control section performs no role in phase-locking the lateral modes of the laser or in steering or switching the output beam angle. This phase control section is used to accomplish continuous wavelength tuning, free from longitudinal cavity mode hopping. The successful operation of this device requires that the electrical current to the phase control section be related to the electrical current to the grating wavelength-tuning section in such a manner that their ratio remains constant. Finally, the semiconductor diode laser is a distributed Bragg reflector type in the patent of Yamaguchi.

An article titled *High Power, High Brightness 2W and 3W cw AlGaAs Laser Diode Arrays with Long Lifetimes* by M. Sakamoto et. al. in Electronics Letters, Vol. 26, No. 11, dated May 24, 1990, discloses two types of AlGaAs single-quantum-well separate-confinement heterostructure (SQW-SCH) cw high power lasers. No discussion is made of any attempt to phase-lock the resultant laser beams. No discussion is made of beam scanning or switching. It is presumed that the laser emits in a broad twin-lobed far-field beam.

An article titled *Tilted-Mirror Semiconductor Lasers* by J. Salzman et. al. in the Appl. Phys. Lett. Vol. 47, No. 1, dated Jul. 1, 1985, discloses a broad-area GaAs heterostructure laser with a titled mirror. The tilted mirror was fabricated by etching, and the laser is operated in a smooth and stable single lateral mode with a high degree of spatial coherence. Construction of these lasers differ significantly from the construction of the lasers disclosed herein. For example, the mirror surfaces of the disclosed laser are created by cleaving the semiconductor material.

An article titled *Modal Analysis of Semiconductor Lasers with Nonplanar Mirrors* by J. Salzman et. al. in the IEEE Journal of Quantum Electronics, Vol. QE-22 No. 3, dated Mar. 3, 1986 discusses phase locking broad-area lasers with nonplanar mirrors. The disclosure is similar to that disclosed in the previous article by the same author disclosed herein.

An article titled *Laser Beam Scanning Using a Local Deflector Integrated with an Effective Mode Filter* by S. Mukai et. al. in Appl. Phys. Lett. Vol. 51 No. 25, dated Dec. 21, 1987 discloses semiconductor lasers where an injection-type deflector is combined with a long waveguide, resulting in an effective mode filter. The beam deflection mechanism of the device is prismlike when the deflector was short. The laser cavity consists of a beam-deflecting front part with twin nitride-stripe electrodes and a rear part with a very long mesa-striped waveguide. The invention disclosed herein only requires one electrode for beam scanning or switching.

An article titled *Analysis of a Double-Heterostructure Spatial-Phase Controller for Diode-Laser Beam Steering* by S. Mukai et. al. in the IEEE Journal of Quantum Electronics, Vol. 24, No. 12 (December 1988) is another disclosure of the lasers discussed in the previously referenced article by S. Mukai. The phase controlled by two electrodes in a front part. The rear part of the laser is a longer mode filter.

An article titled *Beam Scanning and Switching Characteristics of Twin-Striped Lasers with a Reduced Stripe Spacing* by S. Mukai et. al. in Optical and Quantum Electronics 17 (1985), pp. 431-434, discusses output-beam scanning and switching characteristics of lasers with separately controlled twin-stripe electrodes. The spacing between the two stripes is small, 5 microns from center to center. No integrated phase controller is shown, and the invention disclosed therein does not require twin-stripe electrodes.

An article titled *Beam Scanning with Twin-Strip Injection Lasers* by D. Scifres et. al. in Appl. Phys. Lett. Vol. 33 No. 8, dated Oct. 15, 1978, discloses angular scanning of the far-field intensity peak of a GaAs/GaAlAs double heterostructure (DH) injection laser. The scan is accomplished by adjusting the current levels between two closely-spaced stripe contacts, thereby creating an asymmetric gain/refractive index profile through which the laser beam propagates. The laser disclosed herein allows beam scanning and switching through the use of an integrated phase controller without the necessity of using a double stripe.

An article titled *Integrated Injection-Locking High-Power Diode Laser Arrays* by J. P. Hohimer et. al. in Appl. Phys. Lett. Vol. 55 No. 6, dated Aug. 7, 1989, discloses an integrated injection-locked high-power cw diode laser array with an on-chip independently controlled master laser. The device emits a near-diffraction-limited single-lobed far-field emission beam at single-facet powers up to 125 mW. Additionally, beam steering is accomplished by current tuning the emission wavelength of the master laser. The device integrates a master laser (ML) on the same chip as the slave array (SA) while minimizing feedback effects to the ML. The invention disclosed herein does not utilize a ML to phase lock the laser.

An article titled *Injection-Locking Characteristics of Gain-Guided Diode Laser Arrays with an "On-Chip" Master Laser* by J. P. Hohimer et. al. in Appl. Phys. Lett. Vol. 56 No. 16, dated Apr. 16, 1990, reported measurements of the laser disclosed in the authors' previously mentioned article.

An article titled *Interelement Coupling in Gain-Guided Diode Laser Arrays* by J. P. Hohimer et. al. in Appl. Phys. Lett. Vol. 48 No. 22, dated Jun. 2, 1986, discusses the use of single-channel injection locking to study the interelement coupling behavior in a gain-guided diode laser array. This differs from the invention disclosed herein where the phase controller is integrated with the active laser.

DISCLOSURE OF THE INVENTION

The invention disclosed herein is a semiconductor laser having a plurality of epitaxial layers, comprising: (a) a first contact metallization layer; (b) a substrate located above the first contact metallization layer; (c) a first cladding layer located above the substrate; (d) an active lasing layer located above the first cladding layer providing lasing action; (e) a second cladding layer located above the active lasing layer; the first cladding layer, the active lasing layer, and the second cladding layer forming a diode lasing structure having a heterojunction; (f) an second contact metallization layer located above said second cladding layer; (g) two uncoated cleaved facets orthogonal to the active lasing layer forming two parallel reflective surfaces; (h) a resonant cavity formed in the active lasing layer by the cleaved facets to provide feedback for the lasing action; (i) an intracavity spatial phase controller formed by segmenting the second contact metallization layer into a phase controller region and a main lasing region, wherein the segmentation electrically isolates the phase controller region from the main lasing region, and the intracavity spatial phase controller underlies the phase controller region in the active lasing layer; and the intracavity spatial phase controller operating to change the emission beam from a normally broad far-field emission beam generated by the lasing action into a single near-diffraction-limited beam. The spatial phase controller has two operating modes, a thermal operating mode and a gain operating mode, wherein each of the operating modes alters the refractive index in the active lasing layer underlying the phase controller region to modify the phase and angle of said emission beam.

BRIEF DESCRIPTION OF THE DRAWINGS

Details of this invention are described in connection with the accompanying drawings in which.

DETAILED DESCRIPTION

Figure 1:
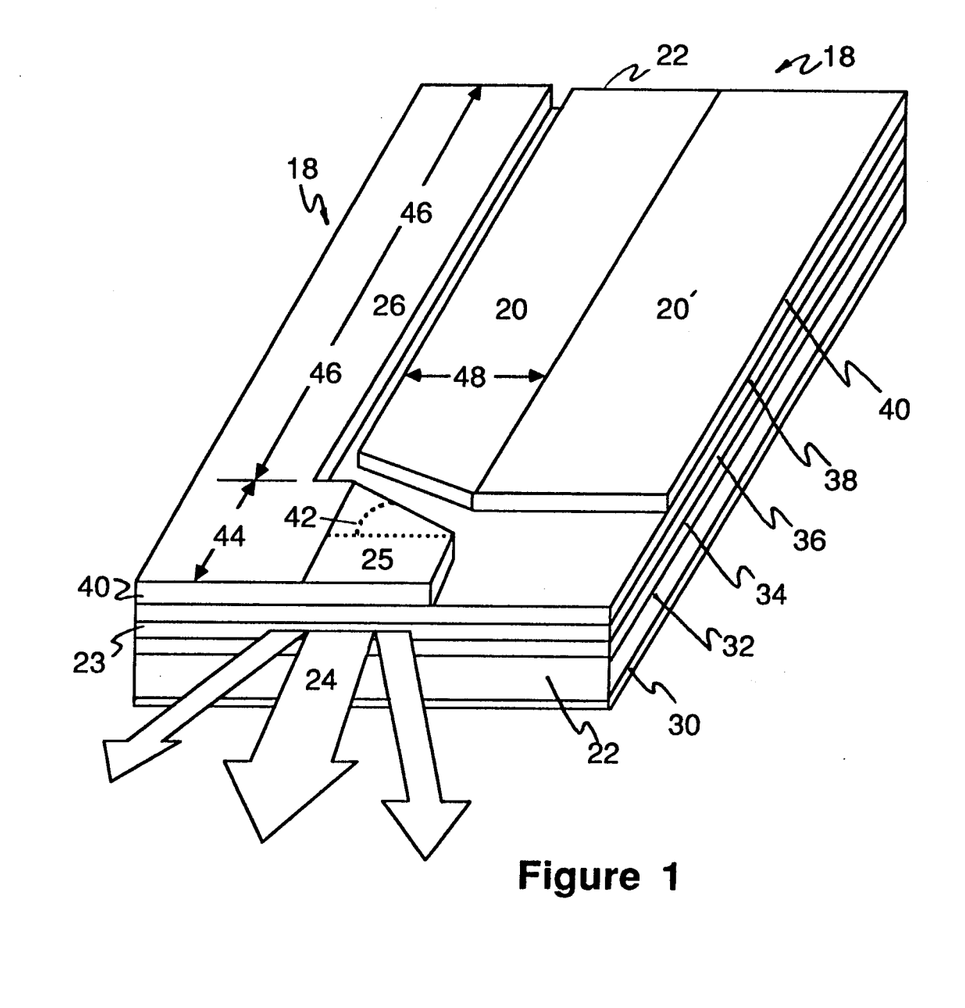
FIG. 1 is a schematic drawing of the first embodiment of the invention. This embodiment employs a single spatial phase control section.

An article entitled *Near-Diffraction-Limited Angle-Switchable Output Beam from a Broad-Area Diode Laser with an Intracavity Spatial Phase Controller* by J. P. Hohimer in Appl. Phys. Lett. Vol. 58 No. 25, dated Jun. 24, 1991, is authored by the inventor and discloses the invention herein, which article is hereby incorporated by reference. Referring now to FIG. 1, the basic embodiment of the invention is shown as a broad-area semiconductor diode laser device 18 with a single intracavity spatial phase controller 25. In the disclosed invention, the epitaxial layer structure for the semiconductor laser is of conventional GaAs/AlGaAs single-quantum-well graded-index separate-confinement-heterostructure (GRIN-SCH) design.

By way of example only, a method for fabricating this epitaxial layer structure is by metal-organic chemical vapor deposition (MOCVD) on a (100)-oriented, Si-doped ($1 \times 10^{18}$ cm$^{-3}$) n-type BaAs substrate 32. In this method, a 1.0-$\mu$m GaAs:Se n-type buffer layer ($1 \times 10^{18}$cm$^{-3}$) is initially grown followed by at least a 1 $\mu$m Al$_{0.60}$Ga$_{0.40}$As:Se n-type ($5 \times 10^{17}$ cm$^{-3}$) optical confinement cladding layer 36 comprising a 0.2-$\mu$m Al$_x$Ga$_{1-x}$As linearly graded (x=0.6–0.3) layer, a single 100 angstrom undoped GaAs quantum well, and a 0.2-$\mu$m Al$_x$Ga$_{1-x}$As linearly graded (x=0.3–0.6) layer; a 1.5-$\mu$m Al$_{0.60}$Ga$_{0.40}$As:Zn p-type ($8 \times 10^{17}$ cm$^{-3}$) optical confinement cladding layer 38 and a 0.1-$\mu$m GaAs:Zn p-type ($1 \times 10^{19}$ cm$^{-3}$) surface cap layer. Other epitaxial growth techniques including molecular beam epitaxy (MBE) and liquid phase epitaxy (LPE). Other direct gap semiconductor material systems, such as other Type III/V and Type II/VI and other epitaxial layer structures, are applicable to the present invention. For example, step and parabolic grading can be incorporated, as well as non-graded systems; however, grading allows the carriers to recombine more efficiently and permit the carriers to more readily reach the quantum well. The undoped active region 36 should be slightly thicker than the wavelength of interest.

The spatial phase controller 25 is formed by segmenting the upper contact metallization 40 which may be of Ti/Au on the p-side of the p-n semiconductor heterojunction into two regions: the spatial phase controller 25 and a main lasing region 20. Thus, the spatial phase controller 25 has the same epitaxial, i.e., p-n heterojunction, structure as the laser itself. The spatial phase controller 25 underlies the phase control contact pad 26 in the main lasing layer 36. The phase control contact pad 26 can be electrically contacted to prevent the spatial phase controller 25 from being damaged by direct contact. The application of an electrical current to the spatial phase controller 25 converts the laser from a dephased to a phase-locked condition. The phase control contact pad 26 may be operated in a forward-biased mode independently of the remainder of the laser device 18. An angle of 45 degrees 42 was selected to separate the spatial phase controller 25 from the lasing region 20, but other angles can be used depending on the width and length of the lasing region 20, but it is preferred that the path length between the lasing region 20 and the spatial phase controller 25 be constant if it is desired to have a linear phase shift of the light across the gap. The spatial phase controller 25 is compact with its length varying in the lateral direction to produce a lateral variation in the optical path length through the spatial phase controller 25. The linear variation in the optical path length is build into the design of the spatial phase controller 25 so that only a single electrical contact is required. The patterned contact metallization 40 is also split along one side of the main lasing region 20 to form a wire bonding region for attaching wires to supply electrical current to the spatial phase controller 25. The remainder of the lasing active layer 36 underlies the main lasing region 20 and forms the primary gain region for generating laser action and is independently contacted through a bond pad 20' on the main lasing region 20.

Ion implantation is used to define the 100-micron width of the main lasing region 20 and spatial phase controller 25 to electrically isolate the phase control contact pad 26 from the main lasing region 20. As an implant mask, a 100-micron wide layer (1.0 micron thick) of the upper Ti/Au layer of metallization 40 is deposited over the main lasing region 20 and the spatial phase controller 25. After ion implantation (60 keV protons, $3 \times 10^{15}$ cm$^{-2}$ dose), a second (0.6 micron thick) patterned layer of the upper Ti/Au layer of metallization 40 is deposited over the entire main lasing region 20 and phase control contact pad 26 to allow the attachment of bond wires to these regions for electrical current flow for lasing and phase control. An unpatterned Ni/Ge/Au lower layer of metallization 30 is deposited over the substrate 32 as a common path for completing the electrical circuit. The laser device 18 is cleaved to form end-faceted mirrors 22, creating a resonant cavity 23 in the active lasing layer 36. Cleaving along crystalline planes guarantees the parallelism of the reflective surfaces 22 without any further polishing of optical surfaces. External mirrors are not required for lasing feedback as the reflectivity of the diode-air interface is high. However, reflective, anti-reflective, or passivation coatings may also be used. The laser device 18 is mounted junction-up on copper heat sinks for high-power operation.

The semiconductor laser device 18 is constructed of a number of layers deposited on an n-doped semiconductor substrate 32. The active lasing layer 36 is surrounded by two layers of cladding 34, 38. The disclosed embodiment is forward biased, with the p layer of cladding 38 above, and the n layer of cladding 34 below the active lasing layer 36. The upper layer of cladding 38 is covered by the upper, patterned, layer of metallization 40 and the substrate 32 is covered by the lower, unpatterned, layer of metallization 30. Laser light 24 is emitted from the resonant cavity 23 formed by the active lasing layer 36.

The upper layer of metallization 40 is formed into two regions, one the main lasing section 20, the other the phase control contact pad 26. In the embodiment shown, the phase control contact pad 26 is rectangular in shape and ranges between 100 and 400 microns in length for the attachment of bond wires 46. The asymmetric spatial phase controller 25 is 100 microns in length 44 and 100 microns in width 48. In the illustrated embodiment, the asymmetric region 25 is triangular-shaped and is formed with one side parallel to the cleaved face 22, while the other side is at an angle 42 to that face. The desired lateral phase shift profile for phase-locking the broad-area diode laser is generated by the triangular shape of the spatial phase controller 25. The main lasing section has an active width 48 of 100 microns, whereas the length of the rectangular lasing section provides the gain, and if that length is too long, the gain will saturate. Note, the measurements and dimensions disclosed here are included for illustrative purposes only. It is envisioned that other dimensions would work equally well.

The spatial phase controller 25 operates in the forward-biased mode and the spatial phase controller 25 generates a linear variation in the lateral refractive index profile in the direction parallel to the end-facet cavity mirrors 22. This lateral index variation produces a linear variation in the optical path length across the width 48 of the laser device tilting the wavefront slightly off-axis. This tilted wavefront is propagated across the width 48 of the laser device via multiple reflections between the end-facet mirrors 22, phase-locking the laser device 18 across the entire gain region of the device to produce a near-diffraction-limited single-lobed output beam 24. Thus, the spatial phase controller 25 in this invention combines the functions of phase-locking, beam scanning, and angle-switching into a single integrated structure.

The small size of the spatial phase controller 25 allows high-speed operation in two distinct modes of operation: thermal and gain. In the thermal mode of operation, an electrical current pulse heats the active lasing layer 36 via Joule heating in the epitaxial layers and nonradiative recombination in the p-n heterojunction of the spatial phase controller 25 prior to the main lasing pulse. This heating pulse gradually decays over a period of 10–20 microseconds, and generates a linearly varying increase in the refractive index across the width of the laser which phase-locks the laser device 18. This permits bi-directional beam scanning and switching of the lasing output.

Figure 2A:
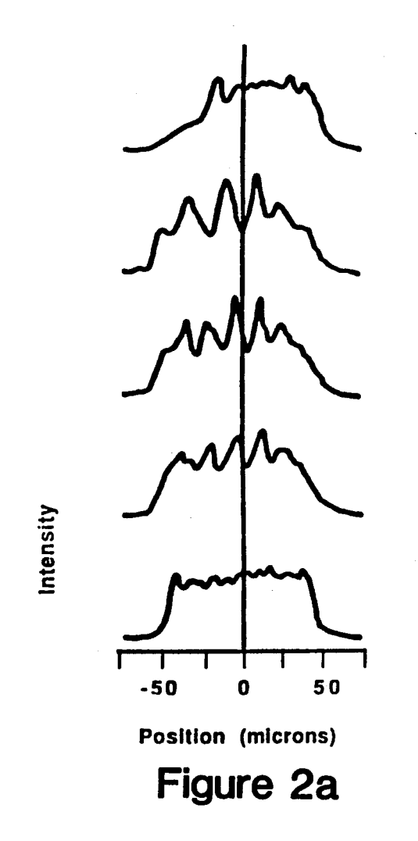
FIG. 2 shows the near- and far-field emission behavior for the invention operated in the thermal mode.
Figure 2B:
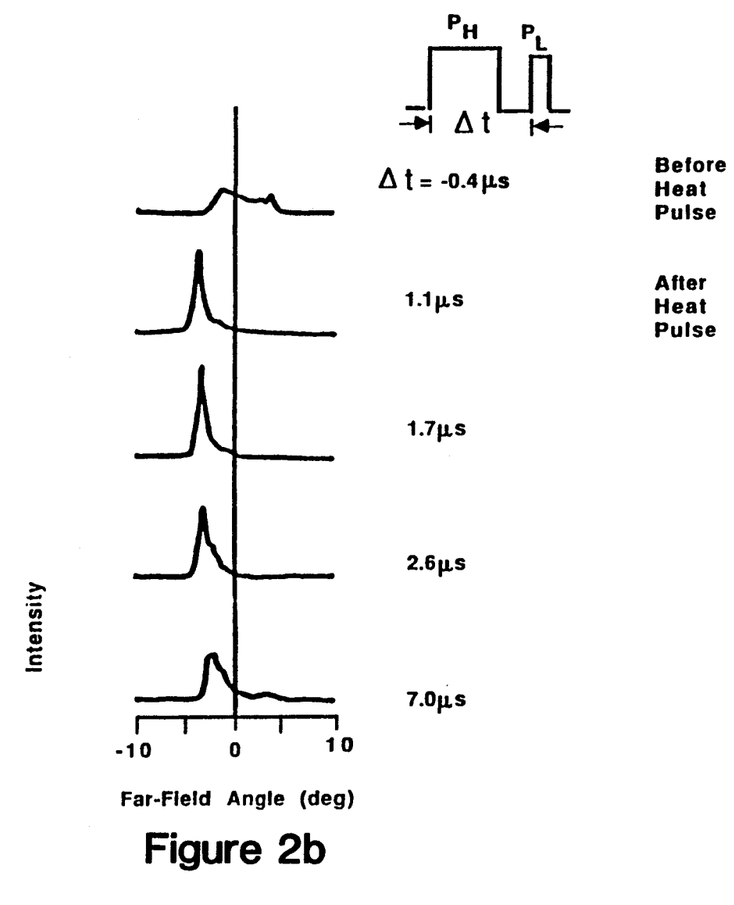

FIG. 2a shows the near-field emission behavior and FIG. 2b shows the far-field emission behavior for a 100-micron wide and 500-micron long broad-area laser with the spatial phase controller operated in the thermal mode. As shown in the timing diagram of FIG. 2b upper right corner, the heating pulse, $P_H$, is applied to the spatial phase controller prior to the arrival of the main lasing pulse, $P_L$, with a time delay $\Delta t$.

In the gain mode of operation, the electrical current pulse to the spatial phase controller 25 overlaps the main lasing pulse. Before the onset of significant heating effects, the presence of carriers in the spatial phase controller 25 produces a linearly varying reduction in the refractive index across the width of the laser device 18, thus phase-locking the device.

Both modes of operation phase-lock the laser device 18 and produce a near-diffraction-limited single-lobed emission beam tilted slightly off-axis by about 4 degrees. Note, however, that because the thermal mode produces an increase, and the gain mode produces a decrease in the refractive index across the width of the laser, the beam angle is opposite for the two modes. Thus, with a fixed current to the spatial phase controller 25, either mode of operation can be selected simply by controlling the timing between the current pulses to the phase controller and the main lasing section. This pulse timing can be used for angle-switching the far-field beam over a range of 8 degrees in the current embodiment. In addition, both modes allow the far-field output beam to be angle-scanned over a range of about 1.5 degrees by varying the magnitude of the current to the phase controller or the timing between the current pulses to the phase controller 26 and main lasing section 20.

Figure 3A:
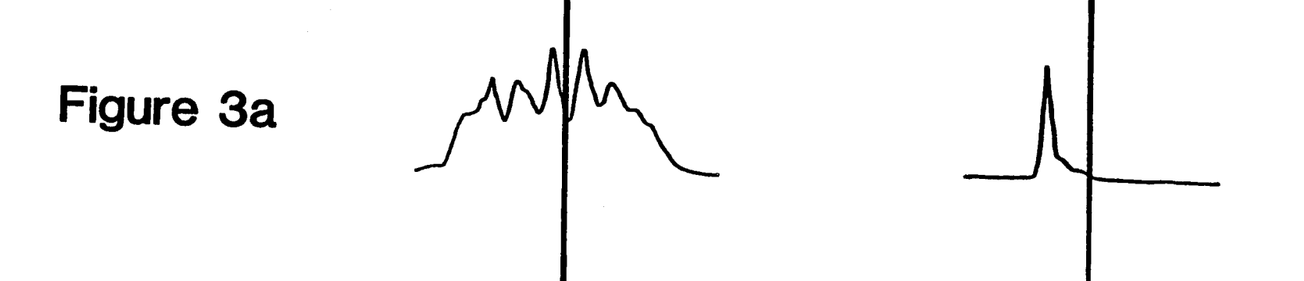
FIGS. 3a and 3b show the angle-switching of the single-lobed far-field emission beam when the invention is switched from thermal to gain mode of operation.
Figure 3B:
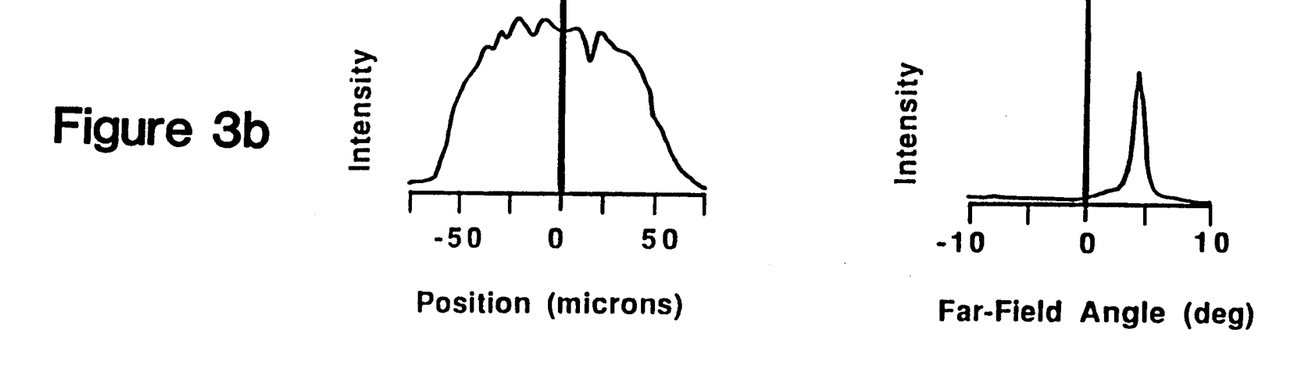

FIG. 3 shows the angle-switching of the single-lobed far-field emission beam when the spatial phase controller is switched from the thermal to the gain mode of operation. In FIG. 3a, for a time delay of $\Delta t = 2.2$ microseconds corresponding to the thermal mode of operation the far-field beam is centered at an emission angle of $-3.9$ degrees. In FIG. 3b, reducing the time delay to $\Delta t = 0.15$ microsecond switches the phase controller to the gain mode of operation because the current pulse to it overlaps that to the main lasing section. In this mode of operation, the laser remains phase locked with an 0.8 degree full-width-at-half-maximum far-field beam but with the emission beam oppositely directed at an angle of $+4.2$ degrees. In this mode of operation, the added gain from the phase controller results in a two-fold increase in output power to 430 mW. As seen in FIGS. 3a and 3b, the single-lobed far-field beam can be angle-switched over a range of ten times its angular width simply by controlling the pulse timing to the spatial phase controller.

Figure 4:
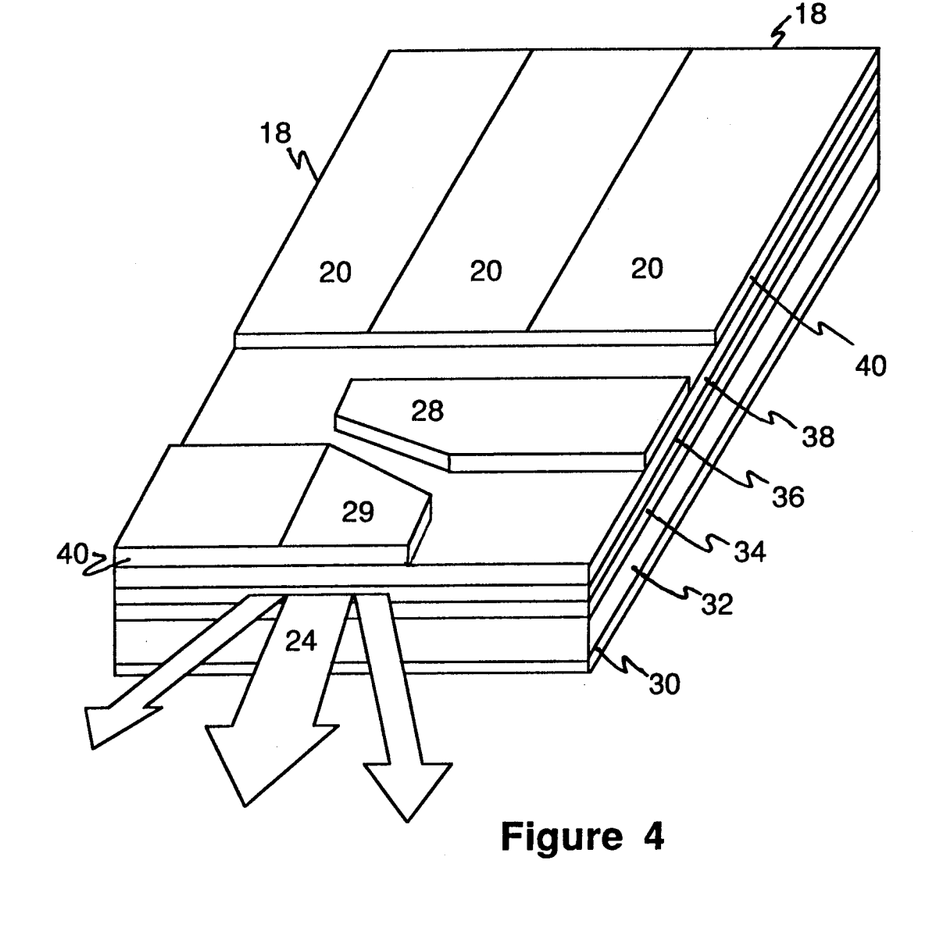
FIG. 4 is a schematic drawing of the second embodiment of the invention. This embodiment employs two anti-symmetric phase controllers.

Referring now to FIG. 4, the second embodiment of the invention is shown. It is identical to the first embodiment except that two anti-symmetric phase controllers 28, 29, instead of the single spatial phase controller 25 used in the embodiment of FIG. 1 are integrated. The second phase controller 29 is identical in function to the phase controller 25 in the first embodiment. The first phase controller 28 is oppositely oriented which results in opposite functionality in terms of thermal and gain modes generate opposite beam angles and the phase shift is reversed from going from one phase controller to another. This allows beam-scanning and angle-switching using only one of the above methods, thermal or gain, for controlling and switching the lateral index profile. It is preferable that the modes not be mixed, however, the modes may be mixed for certain applications wherein a change in the power of the light beam is desired. The gain mode has advantages for increasing switching speed or rate, or for producing equal amplitude output beams. Additionally, the gain mode is more advantageous for cw operation where it is difficult to separate the thermal and gain effects in the spatial phase controller. One of the spatial phase controllers can be connected to the gain region to achieve an increase in gain.

Figure 5:
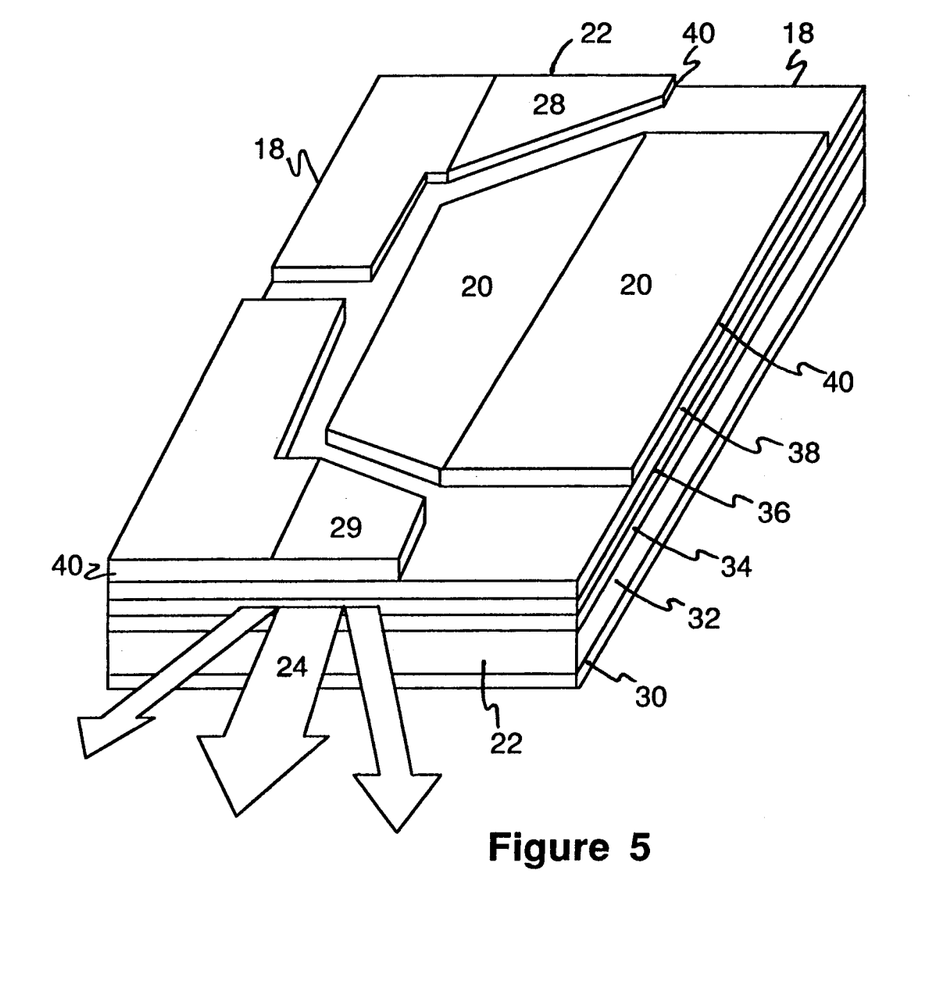
FIG. 5 is a schematic drawing of the third embodiment of the invention. This embodiment employs multiple symmetric phase controllers.

Referring now to FIG. 5, the third embodiment is disclosed. It differs from the first embodiment of FIG. 1 in that multiple (two) symmetric phase controllers 28, 29 are used. Multiple symmetric phase controllers 28, 29 are used to increase the scanning and angle-switching range of the phase controller. Because the phase controllers affect the path of the optical wave as it traverses the laser cavity from one end-facet mirror 22 to the other and to vary this path length across the width of the laser, the phase control sections 28, 29 may be placed at any position along the length of the laser cavity. Note that the second and third embodiments also apply to multi-stripe diode array lasers.

There are also a number of ways envisioned in which this built-in (fixed) lateral index profile can be incorporated into broad-area lasers or multi-stripe arrays.

Impurity-induced layer disordering can be used to selectively alter and tailor the effective lateral index profile across the width of a broad-area laser or array. Such disordering of the single- or multi-quantum-well lasing region can be localized at one end of the device. Alternately, a layered cladding region could be grown above the active lasing layer and subsequently disordered over the entire active lasing layer 36 with a laterally varying disorder depth.

The desired built-in lateral index profile could also be generated by etching partially through the upper waveguide cladding layer 38 immediately above the active lasing layer 36 using wet chemical etching or dry etching methods such as reactive ion etching, reactive ion beam etching, etc. Such etching could be performed in an unpumped low-loss waveguide region within the laser cavity using a patterned etch mask. The etched region alters the effective index which the optical wave encounters in the active lasing layer 36, thus establishing the lateral index profile for device phasing. Further control over the lateral index profile and protection of the exposed cladding region can be achieved by filling in the etched region with suitable materials, e.g., $SiO_2$, $Si_3N_4$, AlGaAs, etc., using deposition or regrowth techniques.

The same effect as a built-in lateral index profile could also be achieved by selectively varying the optical path length across the width of the laser. This can be done by etching or ion milling one or both of the end-facet mirrors 22 at a slight angle. Such etched-facet broad-area lasers have been reported previously but with very large tilt angles on the order of 5-15 degrees. These large etch angles are much larger than the angles predicted for optimum phase locking using the current invention.

The current embodiments disclose 100 micron wide 48 broad-area lasers with intracavity spatial phase controllers. Such phase controllers work equally well with devices of wider or narrower dimensions. In addition, the concepts demonstrated here for phase-locking, beam-steering, and angle-switching can also be applied to high-power, multi-stripe diode laser arrays. Moreover, those skilled in the art will appreciate that the entire integrated layered structure may be reversed. The disclosed concepts can also be extended to cw operation of semiconductor diode lasers.

Although the present invention has been described with a certain degree of particularity, it is understood that the present disclosure has been made by way of example and that changes in details of structure may be made without departing from the spirit thereof.

What is claimed is:

1. A semiconductor laser having a plurality of epitaxial layers, said laser comprising:
   (a) a first contact metallization layer;
   (b) a substrate;
   (c) a first cladding layer layered onto said substrate;
   (d) a broad area active lasing layer located above said first cladding layer, said active lasing layer providing lasing action to produce an emission beam;
   (e) an second cladding layer located above said active lasing layer; said first cladding layer, active lasing layer, and second cladding layer forming a diode lasing structure having a heterojunction;
   (f) an second contact metallization layer located above said second cladding layer;
   (g) two reflecting surfaces, parallel to each other, and orthogonal to said active lasing layer;
   (h) a resonant cavity in said active lasing layer formed by said reflecting surfaces to provide feedback for said lasing action; and
   (i) an intracavity spatial phase controller that affects the phase of said emission beam to produce linear phase variation across a dimension of said laser.

2. A semiconductor laser as described in claim 1 wherein said first contact metallization layer of said semiconductor laser is segmented into a phase controller region and a main lasing region, said intracavity spatial phase controller underlying said phase controller region in said active lasing layer, and said phase controller region being electrically isolated from said main lasing region.

3. A semiconductor laser as described in claim 2 wherein ion implantation is used to define said phase controller region and said main lasing region and to electrically isolate said phase controller region from said main lasing region.

4. A semiconductor laser as described in claim 2 wherein the patterning of said first contact metallization layer defines said spatial phase controller and electrically isolates said phase controller region from said main lasing region.

5. A semiconductor laser as described in claim 2 wherein said spatial phase controller is asymmetric with a triangular shape.

6. A semiconductor laser as described in claim 2 wherein said phase controller region and said main lasing region can be separately electrically contacted and operated independently from each other.

7. A semiconductor laser as described in claim 2 wherein one of said contact metallization layers is further segmented into a plurality of symmetric spatial phase controllers, each of said symmetric spatial controllers being electrically isolated from each other and from said main lasing region, each of said symmetric spatial controllers being capable of independent operation, and each of said symmetric spatial controller operating to modify the phase and angle of said emission beam in the same direction.

8. A semiconductor laser as described in claim 2 wherein one of said contact metallization layers is segmented into anti-symmetric spatial phase controllers, both of said anti-symmetric spatial phase controllers operating to modify the phase and emission angle of said emission beam in opposite directions from each other.

9. A semiconductor laser as described in claim 2 wherein said spatial phase controller has two operating modes, one of said operating mode being a thermal operating mode, and the other of said operating modes being a gain operating mode, each of said operating modes acting to alter the refractive index in the active lasing layer underlying said phase controller region from the refractive index of the active lasing layer underlying the main lasing region to modify the phase and angle of said emission beam.

10. A semiconductor laser as described in claim 9 wherein said thermal operating mode is caused by an electrical current pulse heating said active lasing layer via Joule heating in the epitaxial layers and nonradiative recombination in the heterojunction of said spatial phase controller prior to a main lasing pulse, said main lasing pulse generating a linearly varying increase in the refractive index across the width of said laser, phase-locking said laser.

11. A semiconductor laser as described in claim 9 wherein said gain operating mode is caused by overlapping a main lasing pulse with an electrical pulse to said spatial phase controller when the presence of carriers in said spatial phase controller produces a linearly varying reduction in the refractive index across the width of said laser, phase-locking said laser.

12. A semiconductor laser as described in claim 9 wherein the emission angle of said emission beam can be switched in direction by switching from one of said operating modes to the other of said operating modes of said spatial phase controller.

13. A semiconductor laser as described in claim 1 wherein said second cladding layer, said active lasing layer, and said first semiconductor layer are formed by alternating layers of direct gap semiconductor materials.

14. A semiconductor laser as described in claim 1 wherein said active lasing layer has uniform-lateral-dimension active lasing and spatial phase controller regions for forming a broad-area laser diode.

15. A semiconductor laser as described in claim 1 wherein said active lasing layer is in the form of a plurality of active lasing regions disposed in a parallel manner one to another for forming an array of laser diodes.

16. A semiconductor laser as described in claim 1 wherein said spatial phase controller is incorporated into the epitaxial layer structure of the laser to produce a linearly varying change in the refractive index across the dimension of said laser, phase-locking lateral modes of induced in said broad area active lasing area of said laser.

17. A semiconductor laser as described in claim 16 wherein said spatial phase controller is formed by selective disordering of a region of a multi-quantum-well first cladding layer to form a different optical path length of said emission beam.

18. A semiconductor laser as described in claim 16 wherein said spatial phase controller is formed by etching partially through a region of said first cladding layer to alter the effective lateral refractive index profile in said active lasing layer.

19. A semiconductor laser having a plurality of epitaxial layers, comprising:
(a) a second contact metallization layer;
(b) a substrate located above said second contact metallization layer;
(c) a second cladding layer located above said substrate;
(d) a broad-area active lasing layer located above said second semiconductor layer providing lasing action for a multitude of lateral modes;
(e) a first cladding layer located above said active lasing layer; said second cladding layer, active lasing layer, and first cladding layer forming a diode lasing structure having a heterojunction;
(f) an first contact metallization layer located above said first cladding layer;
(g) two uncoated cleaved facets orthogonal to said active lasing layer forming two parallel reflective surfaces;
(h) a resonant cavity formed in said active lasing layer by said cleaved facets to provide feedback for said lasing action;
(i) an intracavity spatial phase controller formed by segmenting said first contact metallization layer into a phase controller region and a main lasing region, said segmentation electrically isolating said phase controller region from said main lasing region, said intracavity spatial phase controller underlying said phase controller region in said active lasing layer; and
said intracavity spatial phase controller operating to change said emission beam from a normally broad far-field emission beam having said multitude of lateral modes generated by said lasing action into a single near-diffraction-limited beam.

20. A semiconductor laser as described in claim 19 wherein said spatial phase controller has two operating modes, one of said operating mode being a thermal operating mode; the other of said operating modes being a gain operating mode, each of said operating modes acting to alter the refractive index in the active lasing layer underlying said phase controller region from the refractive index of the active lasing layer underlying the main lasing region to modify the phase and angle of said emission beam.

21. A semiconductor laser as described in claim 20 wherein said thermal operating mode is caused by an electrical current pulse heating said active lasing layer via Joule heating in the epitaxial layers and nonradiative recombination in the heterojunction of said spatial phase controller prior to a main lasing pulse, said electrical current pulse heating generating a lineraly varying increase in the refractive index across the width of said laser, phase-locking said laser.

22. A semiconductor laser as described in claim 20 wherein said gain operating mode is caused by overlapping a main lasing pulse with an electrical pulse to said spatial phase controller when the presence of carriers in said spatial phase controller produces a linearly varying reduction in the refractive index across the width of said laser, phase-locking said laser.

23. A semiconductor laser as described in claim 19 wherein said second cladding layer, said active lasing layer, and said first cladding layer are formed by alternating layers of direct gap semiconducting materials.

24. A method to control an emission angle of an emitted beam from a semiconductor laser, comprising:

(a) providing a first electrical pulse to a spatial phase controller of said semiconductor laser; said semiconductor laser having a first contact metallization layer, a substrate, a first cladding layer on said substrate, a broad-area active lasing layer located above said first cladding layer, said broad-area active lasing layer providing lasing action to produce an emission beam, a second cladding layer located above said active lasing layer wherein said first cladding layer, active lasing layer, and second cladding layer forming a diode lasing structure having a heterojunction, a second contact metallization layer located above said second cladding layer, two reflecting surfaces, parallel to each other, and orthogonal to said active lasing layer, a resonant cavity in said active lasing layer formed by said reflecting surfaces to provide feedback for said lasing action, and said intracavity spatial phase controller;

(b) providing a second electrical pulse to said broad-area active lasing layer to thereby induce said lasing action thereby producing said emitted beam;

(c) and in response to said first electrical pulse, altering an index of refraction in said spatial phase controller across a width of said laser; and (d) changing said emission angle of said emitted beam relative to a magnitude of said first emitted pulse, thereby phase-locking said laser across said width of said broad-area active lasing layer.

25. The method of claim 24, wherein said method operates in a thermal mode such that said second electrical pulse is applied to said laser following a discrete time delay after said first electrical pulse is applied to said laser thereby increasing said index of refraction.

26. The method of claim 24, wherein said method operates in a gain mode wherein an application of said second electrical pulse overlaps an application of said first electrical pulse thereby decreasing said index of refraction.

* * * * *